United States Patent [19]

Ulijasz

[11] Patent Number: 4,549,085
[45] Date of Patent: Oct. 22, 1985

[54] ELECTRO-OPTICAL SIGNAL PROCESSING SYSTEMS AND DEVICES

[75] Inventor: Thaddeus R. Ulijasz, Geneva, Ill.

[73] Assignee: Cooper Industries, Inc., Houston, Tex.

[21] Appl. No.: 484,930

[22] Filed: Apr. 14, 1983

[51] Int. Cl.³ .............................................. G02B 27/00
[52] U.S. Cl. ................... 250/551; 250/227; 455/612
[58] Field of Search ................. 250/226, 227, 551; 455/602, 606, 607, 609, 610, 612, 613, 617, 618, 619; 350/96.16; 357/19

[56] References Cited

U.S. PATENT DOCUMENTS

| | | | |
|---|---|---|---|
| 3,532,890 | 10/1970 | Denton | 250/199 |
| 3,755,676 | 8/1973 | Kinsel | 250/199 |
| 3,936,144 | 2/1976 | Caton | 350/96 C |
| 3,979,587 | 9/1976 | de Cremoux | 357/19 |
| 4,050,784 | 9/1977 | Kobayashi | 350/96 C |
| 4,054,366 | 10/1977 | Barnoski et al. | 350/96 C |
| 4,060,308 | 11/1977 | Barnoski et al. | 350/96 C |
| 4,145,109 | 3/1979 | Nelson | 350/96.14 |
| 4,146,297 | 3/1979 | Alferness et al. | 350/96.14 |
| 4,146,783 | 3/1979 | Desbois et al. | 250/199 |
| 4,152,713 | 5/1979 | Copeland et al. | 357/19 |
| 4,216,486 | 8/1980 | Geddes | 357/19 |
| 4,217,598 | 8/1980 | D'Auria et al. | 250/551 |
| 4,223,216 | 9/1980 | Quick et al. | 250/226 |
| 4,228,349 | 10/1980 | Ettenberg et al. | 250/226 |
| 4,234,969 | 11/1980 | Singh | 455/607 |
| 4,234,970 | 11/1980 | Beasley et al. | 455/607 |
| 4,243,297 | 1/1981 | Elion | 350/96.15 |
| 4,244,045 | 1/1981 | Nosu et al. | 370/3 |
| 4,252,404 | 2/1981 | DiVita | 350/96.16 |
| 4,268,756 | 5/1981 | Crouse et al. | 250/551 |
| 4,274,706 | 6/1981 | Tangonan | 350/96.19 |
| 4,279,464 | 7/1981 | Colombini | 350/96.19 |
| 4,281,253 | 7/1981 | Culver | 250/551 |
| 4,289,373 | 9/1981 | Sugimoto et al. | 350/96.16 |
| 4,292,512 | 9/1981 | Miller et al. | 455/612 |
| 4,294,508 | 10/1981 | Husbands | 350/96.15 |
| 4,301,543 | 11/1981 | Palmer | 455/612 |
| 4,317,232 | 2/1982 | Pickett et al. | 455/606 |
| 4,327,971 | 5/1982 | Kondo et al. | 350/388 |
| 4,369,524 | 1/1983 | Rawson et al. | 455/607 |

OTHER PUBLICATIONS

Silicon and Lead Sulfide Two Color Detectors, Hamamatsu Product Bulletin PB-108-01, Jan. 1982.
Forrest, S. R., Photodiodes for Long-Wavelength Communication Systems, Fiberoptic Technology, Dec. 1982, pp. 81-84.

Primary Examiner—David C. Nelms
Attorney, Agent, or Firm—Fitch, Even, Tabin & Flannery

[57] ABSTRACT

Apparatus for processing multiple discrete signals utilizing a light propagating medium such as a fiber optic strand or the like includes a first electro-optical emitter-detector pair which is transparent to the wavelength of a signal of a second electro-optical emitter-detector pair. The signal of the second pair passes through at least a portion of the first emitter and first detector without substantial electro-optical conversion, and the two signals may propagate through the medium in the same or in opposite directions. Filters may be used to prevent interference between the two emitter-detector pairs, and lenses may be added to focus the signals, if desired.

13 Claims, 5 Drawing Figures

ELECTRO-OPTICAL SIGNAL PROCESSING SYSTEMS AND DEVICES

FIELD OF THE INVENTION

This invention relates to electro-optical signal processing systems and electro-optical signal processing devices, and more particularly to multiple signal electro-optical transmission and detection systems and devices which do not require optical couplers, optical splitters or the like.

DESCRIPTION OF THE PRIOR ART

Multiple individual optical signals may propagate simultaneously through a light guiding medium such as a fiber optic strand without substantial intermodulation or other interference, provided that the respective signals have carrier wavelengths which are sufficiently separated from each other. The signals may propagate in one or both directions in the medium, and each signal may be separately encoded or modulated in any suitable manner. Such propagation is possible in fiber optic strands in part because the fiber optic strands have a broad useful bandwidth. With such a broad bandwidth, a number of signals having different respective wavelengths may propagate in the fiber simultaneously and be processed in a variety of ways. The number of channels available in a particular frequency band depends in part on the ability of the associated electro-optic emitting and detecting devices to separate and process the signals.

Multiple optical signals propagating in a single fiber optic strand may be separated and further processed with the use of optical couplers, optical splitters and light filters, as seen in U.S. Pat. Nos. 4,244,045, 4,289,373 and 4,228,349. The light filters may be reflective filters which pass light in a particular frequency band and reflect other light, absorptive filters which absorb light which is not in their pass bands, and bandgap filters, which absorb light having a relatively short wavelength, and pass light having a relatively long wavelength. Bandgap filters are described in U.S. Pat. No. 4,228,349. However, such systems having splitters, couplers and the like may require sensitive adjustment and periodic maintenance for proper operation. The added elements provide only limited isolation between signals, which may result in harmful interference and may attenuate the signals. The expense and complexity of the system is also increased.

A bi-directional electro-optical signal processing system which does not use optical couplers or optical splitters is shown in U.S. Pat. No. 4,216,486. In that patent, a single semiconductor device has a light detecting zone and a light emitting zone which concurrently interface with an optical fiber. Optical isolation between the zones is provided by a physical barrier placed between them or by non-simultaneous operation, but the emitter may interfere with the detector if light reflects around the barrier from surrounding surfaces, because the detector is likely to be responsive to the emitter signal. Fabrication of single substrate devices which are not responsive to each other is relatively difficult because the emitter and detector must be doped differently to operate at different wavelengths. Further, the size of the devices is limited, which reduces the performance capability, because the intensity of the light generated by the emitter and the sensitivity of the detector are both reduced by being limited to less than half of the optical area of the optical fiber. Thus, there is a need for simple, relatively inexpensive multiple signal optical transmission and detection systems and devices which do not require sensitive adjustments for proper operation, and may operate without the use of optical couplers or the like. There is also a need for optical signal processing systems with improved signal isolation and reduced interference while providing maximum coupling to the fiber optics light path.

SUMMARY OF THE INVENTION

In keeping with one aspect of this invention, apparatus for processing multiple optical signals having significantly different wavelengths through a light propagating medium having two ends, such as a fiber optic strand, includes an inner light emitting diode optically coupled to either end of the medium and an inner photodiode detector optically coupled to the other end of the medium. The inner emitter and inner detector are capable of processing a relatively short wavelength optical signal through the medium. An outer electro-optical emitter is also optically coupled to either end of the medium, and an outer electro-optical detector is optically coupled to the other end of the medium. The outer emitter and outer detector are capable of processing a relatively long wavelength signal through the inner diode emitter, the inner diode detector, and the medium. The inner emitter and inner detector have a bandgap wavelength which is less than the wavelength of the long wavelength signal, so that the inner emitter and inner detector are substantially electro-optically transparent to the long wavelength signal. The signal processing devices at each end of the medium are arranged so that the signal of the outer emitter and outer detector passes through at least a portion of the inner emitter and inner detector without substantial electro-optic conversion. The two signals may propagate through the medium in the same direction, or in opposite directions, and additional emitters and detectors may be added to process more signals, if desired. Filters may be used to further improve isolation between the emitter-detector pairs, and lenses may be added to focus the signals, if desired.

Accordingly, one aspect of this invention is to provide new and improved multiple signal optical signal processing systems which do not require optical couplers, optical splitters or the like.

Another aspect is to provide new and improved electro-optic emitter devices for such systems.

BRIEF DESCRIPTION OF THE DRAWINGS

The above-mentioned and other features of this invention and the manner of obtaining them will become more apparent, and the invention itself and its operation will be best understood by reference to the following description of the invention, particularly when taken in conjunction with the accompanying drawings, in which.

DESCRIPTION OF PREFERRED EMBODIMENTS

Figure 1:
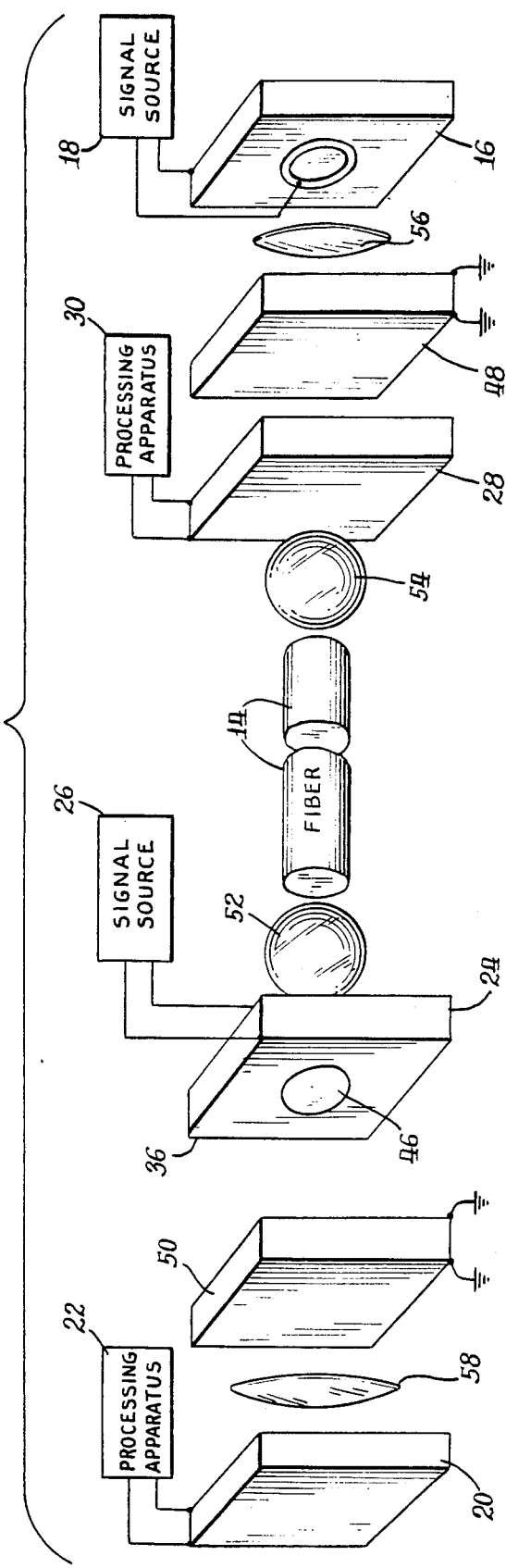
FIG. 1 is a partially stylized and partially diagrammatic illustration of an embodiment of this invention which is capable of simultaneous bi-directional signal processing.
Figure 2:
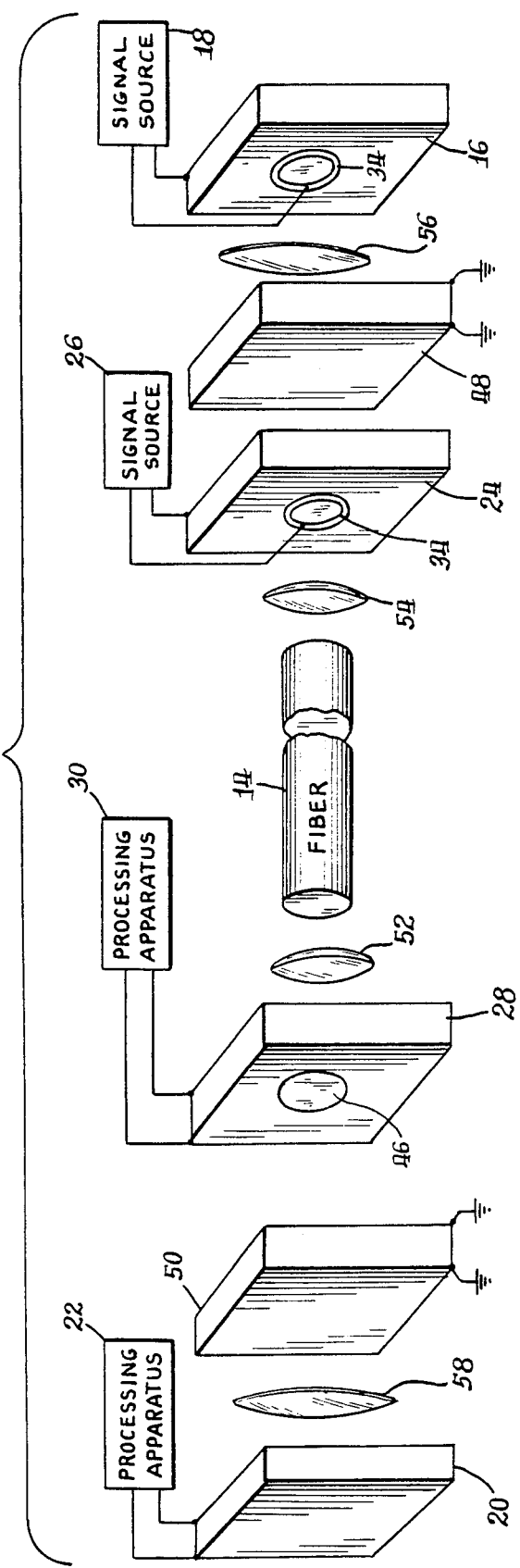
FIG. 2 is a partially stylized and partially diagrammatic illustration of an alternate embodiment of the invention capable of simultaneously processing multiple signals in a single direction.

Multiple signal optical signal processing systems of preferred embodiments of the present invention are shown in FIGS. 1 and 2. The systems include a light propagating medium 14, such as a fiber optic strand. The medium 14 could also be air or another medium in the space between two properly directed and focused lenses.

Commercially available fiber optic strands which might be used in this invention are capable of propagating light over a broad band of wavelengths from about 400 nanometers (nm) to about 1,800 nm. The useful bandwidth of the strand may be up to about 14 GHz-km, and attenuation may be as low as 1 db/km or less. Multiple signals may propagate through the strand in the same direction, or in both directions, simultaneously.

Figure 3:
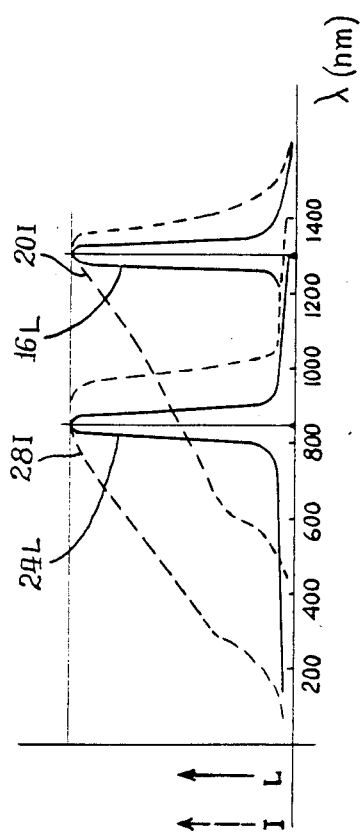
FIG. 3 is a graphic illustration of response curves for exemplary electro-optic devices used in the present invention.

The systems of FIGS. 1 and 2 both include an outermost light emitting source 16 connected to a signal source 18, and an outermost light detector 20 connected to signal processing apparatus 22. The emitter 16 and the detector 20 may be any suitable devices capable of processing an individual light signal having a relatively long wavelength through the medium 14. Semiconductor devices are suggested because of their low cost, availability and compatibility with the rest of the system. The solid line designated 16L in FIG. 3 represents the light output (L) of an exemplary light-emitting source 16 as a function of wavelength $\lambda$, and the dotted line designated 20I represents the current output (I) of the corresponding light detector 20 as a function of wavelength.

Both systems also include at least one inner emitter-detector pair, such as a light emitting diode 24 connected to a signal source 26, and a photodiode detector 28 connected to processing apparatus 30. The inner emitter-detector pair is capable of processing a second optical signal through the medium 14. The second signal must have a significantly different wavelength from that of the long wavelength signal, and must be shorter than the wavelength of the long wavelength signal, for reasons which will be seen. The basic difference between the systems of FIGS. 1 and 2 is that FIG. 1 shows a system capable of simultaneous bi-directional signal processing, and FIG. 2 shows a uni-directional system in which the positions of the emitter 24 and the detector 28 are reversed from their positions in FIG. 1.

The detector 28 and emitter 24 may be any of a number of semi-conductive devices, and may be of Group IV semiconductor material such as silicon or germanium, or Group III-IV material such as gallium arsenide or the like. The emitter 24 includes a pn junction which emits light having an intensity L, designated 24L in FIG. 3, over a predetermined characteristic spectral widwidth when the junction is forward biased. The detector 28 includes a pn junction, PIN junction or the like which absorbs light over essentially the same band of wavelengths when reverse biased, generating a current I, designated 28I in FIG. 3.

The detector 28 responds only to photons of light having sufficient energy to create electron-hole pairs upon impact with the pn junction of the detector, absorbing the photons and generating current. Since the energy of photons of light is directly proportional to frequency ($E = hf$, where E is energy, f is frequency and h is Planck's constant), and inversely proportional to wavelength ($E = hc/\lambda$, where c is the speed of light and $\lambda$ is wavelength), only light having a wavelength which is shorter than a critical wavelength will generate electron-hole pairs and be detected. Light having a longer wavelength will pass through the detector without substantial electro-optical interaction because the energy of the photons is insufficient to generate electron-hole pairs. Thus, the pn junction in a semi-conductor detector is essentially transparent to light having a wavelength which is longer than the critical wavelength. This critical wavelength is known as the bandgap wavelength of the pn or PIN junction, and is determined by the substrate materials, dopant materials and dopant concentrations of the device. In the response curve 28I in FIG. 3, the bandgap wavelength is to the right of the peak, and is about 900 nm.

The same principle applies to the emitter 24, although in a somewhat different manner. A light emitting diode is basically a forward-biased pn junction. As excited electron-hole pairs created by current in the junction return to their normal state, they emit photons of light. The wavelength of the light, which actually is light over a fairly narrow band of wavelengths, is a function of the substrate material, the dopant materials and the dopant levels. Since the junction is forward biased, it is not as sensitive to externally applied light energy as is a detector, which is reverse-biased, but the emitter will respond to such light if the wavelength of the externally applied light is shorter than the bandgap wavelength of the emitter. Such externally applied light changes the output characteristics of the emitter. Such light may cause interference with or distortion of the emitter signal. Thus, it is important that the bandgap wavelength of an emitter be established so that the device is not responsive to light of wavelengths above a particular wavelength.

This invention uses the principle just described, referred to as the bandgap principle, to process multiple optical signals without optical couplers, optical splitters and the like. By making the emitter-detector pair 24, 28 closest to the light guiding medium relatively transparent to light above a predetermined bandgap wavelength, and making the outer emitter-detector pair 16, 20 operate at a wavelength which is longer than the bandgap wavelength of the inner pair, the long wavelength signal of the outer emitter-detector pair 16, 20 simply passes through the short wavelength emitter 24 and detector 28. In addition, since the inner detector 28 absorbs light photons in the short wavelength signal, most of the short wavelength signal does not reach the long wavelength signal processing apparatus. Thus, signal isolation is significantly improved over that of systems using reflective or absorptive filters, and electro-optic interference is reduced. If only reflective or absorptive filters were used to isolate the long wavelength emitter and detector from the short wavelength devices, optical couplers and splitters would normally be used.

While the required bandgap wavelengths may be obtained using a variety of substrate materials and dopants which are currently available, it is preferred at this time that silicon be used for the detector 28, gallium aluminum arsenide be used for the emitter 24, indium gallium arsenide phosphide be used for the emitter 16 and that indium gallium arsenide phosphide or a germanium substrate device be used for the detector 20. Preferred wavelengths are 850 nm for the inner emitter 24 and inner detector 28, and 1,300 nm for the outer emitter 16 and outer detector 20, because currently available optical fibers have low losses at those wavelengths. The preferred wavelengths may be obtained by using materials and techniques which are known in the art. The preferred wavelengths and materials may change as new devices are developed.

The emitter 16 and the detectors 28 and 20 are generally constructed in a conventional manner well known in the art. The emitter 24, however, is specially constructed to be substantially transparent to the second, long wavelength signal, while generating the first, short wavelength signal.

Figure 5:
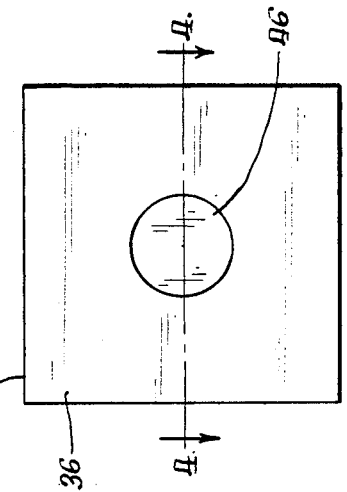
FIG. 5 is a face view of one surface of the light emitting diode shown in FIG. 4.
Figure 4:
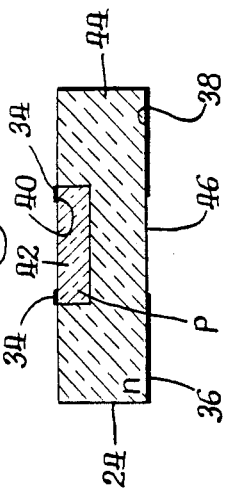
FIG. 4 is a horizontal sectional view of a light-emitting diode used in the apparatus shown in FIGS. 1 and 2, taken along line 4—4 in FIG. 5.

As seen in the example shown in FIG. 4, the electro-optical emitter 24 may conventionally include conductive surfaces 34, 36 of metal or the like on respective sides 40, 38 of a pn junction for electrical connection to the p region 42 and the n region 44 of the device, respectively. Many other known emitter configurations can be used. To improve the electrical connection and increase the amount of light generated, the contact surface 36 of the emitter preferably extends across substantially the entire side 38, except for an unmetallized spot 46 in the center as needed to permit the transmission of light. The size of the conductive surface 34 is restricted because the light must propagate through the side 40, and light generally does not pass through such conductive surfaces. Neither side of the emitter 24 may be totally covered with a conductive surface or the long wavelength signal cannot pass through the emitter 24 without excessive or total attenuation. Thus, the emitter 24 includes a conductive surface 34 on one side 40, as shown in FIG. 4, and a conductive surface 36 on the side 38 (FIG. 5) which defines an essentially optically transparent portion 46 through which the long wavelength signal may pass to the detector 20. The transparent surface 46 may be round, as shown in FIG. 5, or any other suitable shape, such as an etched well or hole, which permits sufficient light to pass through the emitter 24 to be processed in the desired manner. The emitter 16 may be similarly constructed without the transparent spot 46.

Performance of the systems of FIGS. 1 and 2 may be further improved by providing filters and lenses which absorb unwanted light, and focus and direct desired light. A filter 48 provided between the detector 28 and the emitter 16 in FIG. 1 absorbs short wavelength light which passes through the detector 28. A second filter 50 may be provided between the emitter 24 and the detector 20, as well, to absorb light from the emitter 24 which may propagate toward the detector 20. Similar filters may be used in the system of FIG. 2. The filters 48 and 50 may be reflective or absorptive filters, or bandgap filters of the sort described in U.S. Pat. No. 4,228,349, which are semi-conductor diodes in which the p region and the n region are connected together, the bandgap wavelength of the diodes being such that short wavelength light is absorbed, and the long wavelength signal passes without substantial electro-optical conversion.

Lenses 52, 54, 56 and 58 may be added to focus the light signals. The lenses may be commercially available devices familiar to those skilled in the art.

The advantages of this invention are apparent. Multiple bi-directional optical signals may be processed without optical couplers or the like, and the system may be operated easily, without sensitive adjustments or continued maintenance. With fewer parts, which do not require critical alignment and composition, the system is less expensive.

It should be understood that although preferred embodiments of the present invention have been illustrated and described, various modifications thereof will become apparent to those skilled in the art, and, accordingly, the scope of the present invention should be defined only by the appended claims and equivalents thereof. For example, additional emitter-detector pairs could be added to the system, provided that the bandgap wavelength of the various pairs increases from the innermost pair to the outermost.

Various features of the invention are set forth in the following claims.

What is claimed is:

1. Apparatus for processing multiple signals having significantly different wavelengths utilizing a light propagating medium having two ends comprising:
    an inner diode emitter optically coupled to one end of said medium and an inner diode detector optically coupled to the other end of said medium, said inner imitter and inner detector being capable of processing a relatively short wavelength optical signal through said medium, and
    an outer diode emitter optically coupled to one end of said medium and an outer diode detector optically coupled to the other end of said medium, said outer emitter and outer detector being capable of processing a relatively long wavelength optical signal through said inner emitter and inner detector and through said medium,
    the one of said inner diode emitter and said inner diode detector which is optically coupled to the same end of said medium as said outer diode emitter being optially closer to said medium than said outer diode emitter and coaxial with said outer diode emitter, the other one of said inner diode emitter and said inner dioue detector which is optically coupled to the same end of said medium as said outer diode detector being optically closer to said medium than said outer diode detector and coaxial with said outer diode detector,
    said inner emitter and inner detector having a bandgap wavelength which is less than the wavelength of said long wavelength signal, whereby said inner emitter and inner detector are substantially electro-optically transparent to said long wavelength signal, each of the emitters and each of said detectors having a separate substrate.

2. Apparatus according to claim 1 wherein said inner emitter is adjacent said outer detector, and said outer emitter is adjacent said inner detector, said short wavelength and long wavelength signals propagating in said medium in opposite directions.

3. Apparatus according to claim 2 comprising a first filter between said inner emitter and said outer detector, and a second filter between said outer emitter and said inner detector, said filters being substantially opaque to said short wavelength signal, and passing said long wavelength signal.

4. Apparatus according to claim 3 wherein at least one of said filters is a bandgap filter.

5. Apparatus according to claim 1 wherein said inner emitter is adjacent said outer emitter and said inner detector is adjacent said outer detector, said short wavelength and long wavelength signals propagating in said medium in the same direction.

6. Apparatus according to claim 5 comprising a first filter between said inner emitter and said outer emitter, and a second filter between said inner detector and said outer detector, said filters being substantially opaque to said short wavelength signal, and passing said long wavelength signal.

7. Apparatus according to claim 5 wherein at least one of said filters is a bandgap filter.

8. Apparatus according to claim 1 comprising a first lens between said inner emitter and said medium for focusing the output of said inner emitter onto the end of said medium adjacent said inner emitter, and a second lens between said inner detector and said medium for focusing the output of said inner emitter, transmitted by said medium, onto said inner detector.

9. Apparatus according to claim 1 wherein said inner emitter comprises optically opaque conductive members secured to respectiv sides of said emitter, said conductive members bounding unmetallized spots in said sides which define optically transparent portions in said sides for passage of said long wavelength signal.

10. Apparatus according to any of claims 1 to 9 comprising a fiber optic means forming said medium.

11. Apparatus according to any one of claims 1 to 9 wherein said inner emitter is comprised of a gallium aluminum arsenide substrate, said inner detector is comprised of a silicon substrate, said outer emitter is comprised of indium gallium arsenide phosphide, and said outer detector is comprised of a germanium substrate.

12. Apparatus according to any one of claims 1 to 9 wherein said inner emitter is comprised of a gallium aluminum arsenide substrate, said inner detector is comprised of a silicon substrate, said outer emitter is comprised of indium gallium arsenide phosphide, and said outer detector is comprised of indium gallium arsenide phosphide.

13. Apparatus as set forth in claim 1 wherein said inner emitter comprises:
- a substrate having a pn junction, said pn junction having said bandgap wavelength, and
- a first electrically conductive member adjacent the p region of said pn junction, and a second electrically conductive member adjacent the n region of said pn junction, said conductive members being optically opaque and bounding an unmetallized, optically transparent portion in said substrate for passage through said substrate of said relatively long wavelength optical signal.

* * * * *